United States Patent
Kang

(10) Patent No.: US 8,045,121 B2
(45) Date of Patent: Oct. 25, 2011

(54) LIQUID CRYSTAL DISPLAY DEVICE AND FABRICATING METHOD THEREOF

(75) Inventor: Jeong-Ho Kang, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 380 days.

(21) Appl. No.: 12/314,077

(22) Filed: Dec. 3, 2008

(65) Prior Publication Data

US 2009/0147204 A1  Jun. 11, 2009

(30) Foreign Application Priority Data

Dec. 5, 2007  (KR) .................. 10-2007-0125810

(51) Int. Cl.
*G02F 1/1333* (2006.01)
(52) U.S. Cl. ......... 349/152; 349/149; 349/150; 349/151
(58) Field of Classification Search .......... 349/149–152
See application file for complete search history.

(56) References Cited

U.S. PATENT DOCUMENTS

| | | | | |
|---|---|---|---|---|
| 5,189,539 | A | * | 2/1993 | Suzuki ................... 349/150 |
| 7,385,665 | B2 | * | 6/2008 | Matsumoto .............. 349/150 |
| 7,630,048 | B2 | | 12/2009 | Hong et al. |
| 2008/0013029 | A1 | * | 1/2008 | Kim ....................... 349/150 |

FOREIGN PATENT DOCUMENTS

| | | |
|---|---|---|
| KR | 10-2001-0038236 | 5/2001 |
| KR | 10-2007-0044664 | 4/2007 |

* cited by examiner

*Primary Examiner* — Phu Vu
(74) *Attorney, Agent, or Firm* — Morgan, Lewis & Bockius LLP

(57) ABSTRACT

A method for fabricating a liquid crystal display, includes: preparing a first substrate having a first region and a second region positioned at at least one side of the first region, and a second substrate attached to the first region of the first substrate; forming a plurality of gate lines and a plurality of data lines such that they cross each other to define unit pixel regions on the first region of the first substrate, and forming switching elements at crossings of the gate lines and data lines; and extending the gate lines and the data lines of the first region to the second region of the first substrate to form a plurality of pads constituting at least one group, wherein the intervals between pads at every region constituting the single group are the same, and the pad width is different as it goes from the pad positioned at the center toward the outermost pad. When FCTs with a small width size (L/α), namely, a width size of 35 mm, having 642 channels, based on the 17-inch or 19-inch LCD, are attached, misalignment between the pads of the liquid crystal panel and the output wirings of the FCTs attached to the pads can be prevented, and accordingly, a defective LCD can be reduced.

9 Claims, 4 Drawing Sheets

LIQUID CRYSTAL DISPLAY DEVICE AND FABRICATING METHOD THEREOF

BACKGROUND OF THE INVENTION

1. Field of the Invention

The present invention relates to a liquid crystal display (LCD) and a fabricating method of an LCD capable of designing a fine pitch of a pad and an FCT (Film Carrier Tape) output line of a liquid crystal in applying an FCT such as a TCP (Tape Carrier Package), a COF (Chip On Film) or the like having 642 channels of a 35 mm size to a liquid crystal panel based on a liquid crystal display (LCD) of 17 inches or 19 inches, to thereby preventing the occurrence of a short phenomenon due to misalignment of the liquid crystal panel and the FCT.

2. Description of the Related Art

As the Information Age advances, demands for display devices are increasing in various forms, and various flat panel display devices such as LCDs, PDPs (Plasma Display Panels), ELDs (Electro Luminescent Displays), VFDs (Vacuum Fluorescent Displays), or the like, have been studied, some of which have been utilized as display devices in various equipments.

Of them, the LCD having the advantages that it has good picture quality, is light and thin, and consumes low power is commonly employed to replace CRTs (Cathode Ray Tubes) for a mobile video display device. Also, the LCD is used for a mobile device such as a monitor of notebook computers or for a monitor of TVs or computers for receiving and displaying broadcast signals.

In general, the LCD is formed such that two substrates each having electrodes thereon are attached in a facing manner, between which a liquid crystal material is injected, and voltage is applied to the electrodes to generate an electric field to move liquid crystal molecules to thereby display an image according to transmittance of light that varies.

The LCD includes a liquid crystal panel formed by injecting liquid crystal between two substrates, a backlight disposed under the liquid crystal panel and used as a light source, and a driver positioned at an outer edge of the liquid crystal panel and driving the liquid crystal panel.

Here, the driver includes a driving IC in which driving circuits are integrated to apply signals to gate and data wirings (or gate and data lines) of the liquid crystal panel, and the driving circuit is divided into a COG (Chip On Glass), a TCP, a COF, etc., according to how the driving ICs are mounted on the liquid crystal panel.

The COG includes a driving IC on an array substrate of the liquid crystal panel, so the volume of the LCD is increased. The TCP or the COF includes driving ICs by using a separate film, so the driving IC-installed film can be bent to a rear surface of the liquid crystal panel, making the LCD compact. Thus, recently the TCP or the COF is commonly used, and in general, the TCP or the COF is also called a film having the driving ICs installed therein.

The structure of the LCD using the COF will now be described with reference to the accompanying drawings.

FIG. 1 shows the structure of a general LCD, and FIG. 2 is a sectional view of taken along line I-I' of a pad part and a COF attached to the pad part in FIG. 1.

With reference of FIGS. 1 and 2, the liquid crystal panel 10 includes an array substrate 11 and a color filter substrate 12 attached to each other with a uniform cell gap maintained therebetween, and a liquid crystal layer formed by injecting liquid crystal between the two substrate 11 and 12. In this case, the array substrate 11 has a larger area than the color filter substrate 12, so it has a non-image region that is not covered by the color filter substrate 12, on which a plurality of gate and data pads for applying signals to the liquid crystal panel are formed.

Here, the gate pads and data pads on the array substrate 11 are connected with output wirings formed at one side of the COF 30, and in this case the COF 30 includes input wirings formed to be separated from the output wirings, FCTs 31 formed as opened IC regions between the input wirings and output wirings, and driving ICs 32 mounted at the opened IC regions and driving a liquid crystal panel 10.

The input wirings formed at the other side of the COF 30 are connected with a PCB 20. A plurality of elements such as ICs (Integrated Circuits) are formed on the PCB 20 to form drivers, and the drivers generate various control signals and data signals for driving the liquid crystal panel 10 and transfer them to the liquid crystal panel 10.

An anisotropic conductive film (ACF) is commonly used to connect the COF 30 with the driving ICs 32 mounted thereon to the liquid crystal panel 10 and the PCB 20. The ACF, which is formed such that small conductive particles are included in a sort of thermosetting resin film, is attached on a pad of the liquid crystal panel 10 and that of the PCB 20. And then, the COF 30 is attached to fit the pads of the liquid crystal panel 10 and the PCB 20, and then thermo-compressed, so as to electrically contact with each other in a vertical direction.

In this case, however, when the pad of the liquid crystal panel 10 and the output wirings of the COF 30 are thermo-compressed during the TAB (Tape Automated Bonding) processing, a minute misalignment occurs due to heat expansion of the terminal as shown in FIG. 2.

If it is assumed that an overall size (L) of one COF 30 having 642 channels is 48 mm based on a 17-inch or 19-inch LCD like the related art LCD, pitches between the adjacent pads of the liquid crystal panel 10 and pitches between the adjacent output wirings are designed to be about 58 μm, so leeway can be secured to a degree in spite of such misalignment.

However, as efforts for reducing the fabrication cost of the LCD by cutting down the costs of the COF, in case of the 17-inch or 19-inch LCD, the overall size (L) of a single COF including the pad with 642 channels formed thereon and output wirings contacting with the pad of the liquid crystal panel is reduced from 48 mm to 35 mm, resulting in that pitches between the adjacent pads of the liquid crystal panel and pitches between the output wirings of the COF are accordingly reduced to 40 μm.

With the pitch of 40 μm uniformly maintained between the adjacent pads of the liquid crystal panel and between the adjacent output wirings of the COF, a short is generated between the mutually adjacent pads of the liquid crystal panel or between the output wirings of the COF, causing a defective LCD.

SUMMARY OF THE INVENTION

Therefore, in order to address the above matters, the various features described herein have been conceived. One aspect of the exemplary embodiments is to provide a liquid crystal display device and a fabricating method of the LCD, whereby intervals between pads of the entire region of a liquid crystal panel constituting a single group are the same, and the width of the pads positioned at a middle region (referred to as '1' region', hereinafter) while the width of the pads positioned at both side regions (referred to as '2'd region', hereinafter) are different, and whereby intervals between output wirings of the entire region of an FCT are the same, and the interval between output wirings at the first region and those between output wirings at the second region are different.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5b is a graph showing the characteristics of the width of the pads in FIG. 5a.

DETAILED DESCRIPTION OF THE INVENTION

The structure of a liquid crystal display (LCD) and its fabrication method according to the present invention will now be described with reference to the accompanying drawings.

Figure 1:
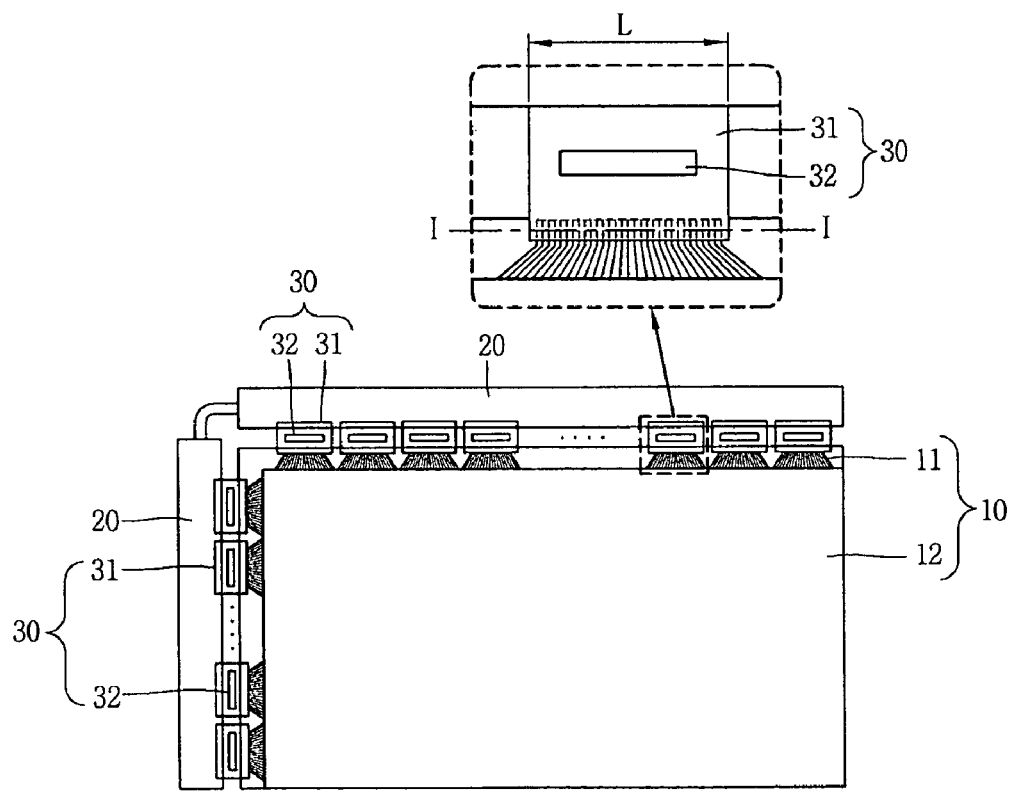
FIG. 1 shows the structure of a liquid crystal display (LCD) according to the related art.
Figure 2:
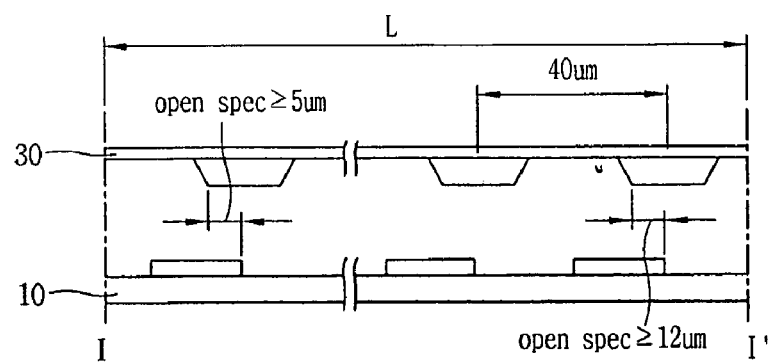
FIG. 2 is a sectional view taken along line I-I' of a pad part of a liquid crystal panel and a COF attached to the pad part in FIG. 1.
Figure 3:
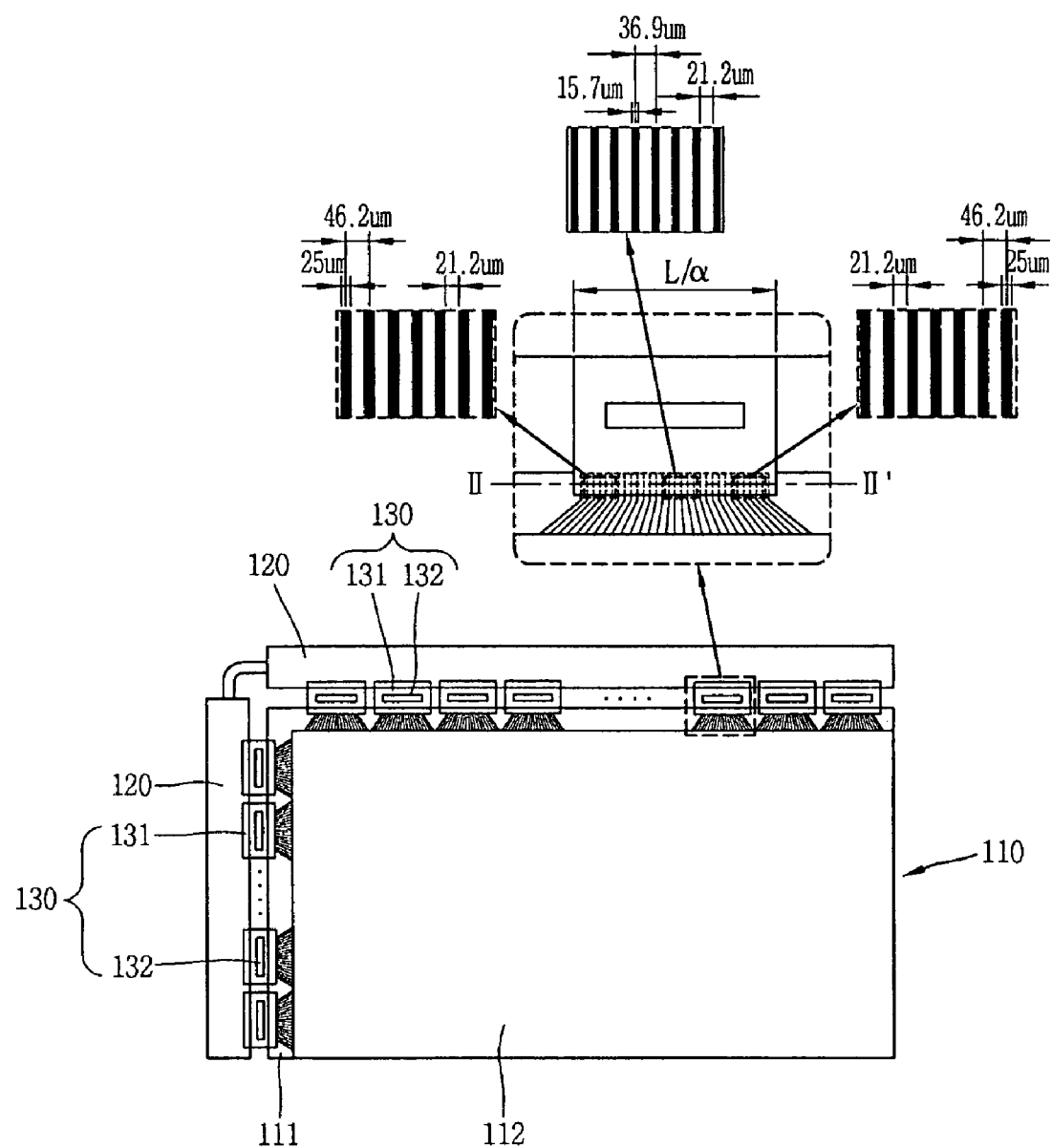
FIG. 3 shows the structure of an LCD according to an embodiment of the present invention.
Figure 4:
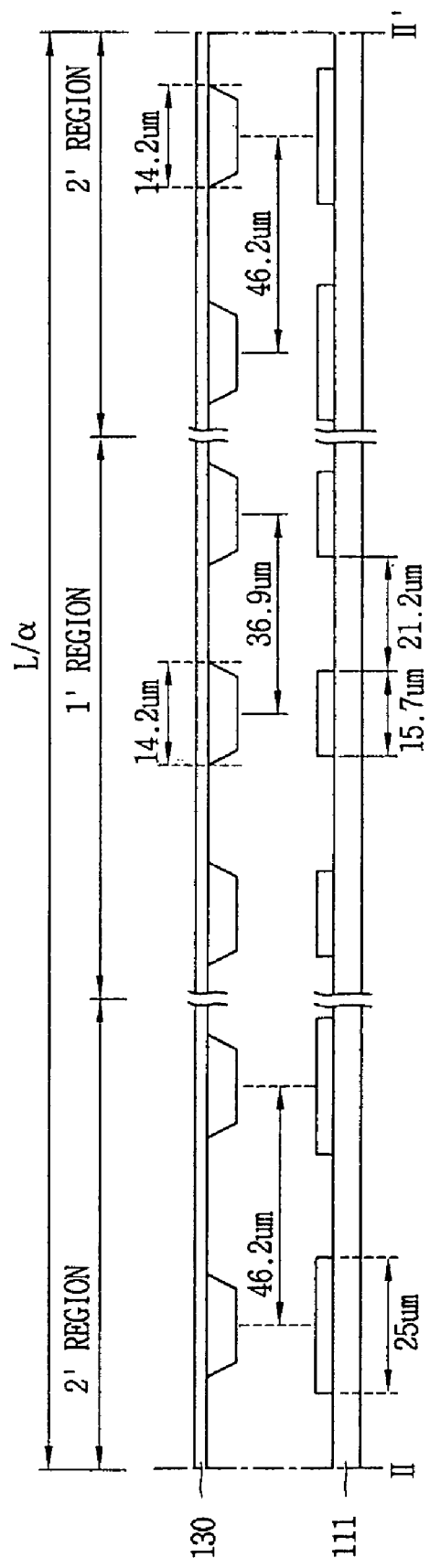
FIG. 4 is a sectional view taken along line II-II' of a pad part of a liquid crystal panel and a COF attached to the pad part in FIG. 3.

FIG. 3 shows the structure of an LCD according to an embodiment of the present invention, and FIG. 4 is a sectional view taken along line II-II' of a pad part of a liquid crystal panel and a COF attached to the pad part in FIG. 3.

As shown in FIGS. 3 and 4, the LCD according to the present invention includes: a driving PCB (Printed Circuit Board) 120 that generates R, G and B data and control signals, a COF 130 attached on the driving PCB 120 and receiving signals; a liquid crystal panel 110 includes the COF 130 on edge region to receive signals to display an image, and a backlight (not shown) provided below the liquid crystal panel 110 and providing light. Here, the COF 130 includes input wirings attached to the driving PCB 120 and receiving data, output wirings formed to be separated from the input wirings, an FCT 131 discriminated as an opened IC region (not shown) between the input wirings and the output wirings, and a driving IC 132 mounted on the opened IC region.

In the present invention, when the entire width L/α of a single COF 130 including 642 channels and formed on at least one side of the liquid crystal panel 110 is 35 mm, the width of each output wiring constituting the 642 channels per COF 130 is the same and the intervals between output wirings becomes different as it goes from the output wirings positioned at the center to the outermost output wirings at edge regions. In addition, the intervals between gate pads or/and data pads (referred to as 'signal' pads', hereinafter) having the 642 channels of the same 35 mm size, namely, L/α, at the edge regions of the liquid crystal panel 110 connected to correspond to each output wiring of the COF 130 are the same, and the width of the signal pads become different as it goes toward the outermost signal pads of the edge regions based on the signal pad positioned at the center.

For example, as shown in FIG. 4, when a plurality of signal pads are formed as at least one group at edge regions of the liquid crystal panel 110, the width of the signal pads positioned at the middle region, i.e. the inner signal pad, namely, at the 1' region, is smaller than that of the signal pads positioned at the 2' regions, i.e. the outer signal pad. As for output wirings of the COF 130 connected to correspond to each of the plurality of signal pads constituting the single group, the intervals between output wirings positioned at the 1' region, the middle region, is narrower than that of output wirings at the 2' regions. That is to say, the interval between the outer signal pads is the same as the interval between the inner signal pads.

First, the liquid crystal panel 110 includes a thin film transistor (TFT) array substrate 111 (first substrate), a color filter substrate 112 (second substrate) which are attached with a uniform cell gap maintained therebetween, and a liquid crystal layer formed by injecting liquid crystal between the first and second substrates 111 and 112. Because the first substrate 111 has a larger area than that of the second substrate 112, it includes an image area (first area) covered by the second substrate 112 and a non-image area (second areas) that is not covered by the second substrate 112 at at least one side of the first area.

Here, on the first area of the first substrate 111 covered by the second substrate 112, there are formed a plurality of gate lines and a plurality of data lines formed in a matrix form, defining a unit pixel region, and connected to the signal pads of the second area by groups to receive signals from the driving PCB 120. A switching element, namely, a thin film transistor (TFT) is formed at each crossing of the gate and data lines and turned on/off according to an external control signal.

On the second area of the first substrate 111 which is not covered by the second substrate, there are formed a plurality of signal pads by groups, which extend from the gate lines and data lines of the first area and apply signals to the liquid crystal panel 110. For example, in the present invention, signal pads of a single group based on 17-inch or 19-inch LCD form 642 channels. Based on the fact that 642 channels form one group, a total of 6 groups of channels are formed at one side of the first area. In this case, the overall width (L/α) of the 642 channels as one group may be about 35 mm, wherein 'L' is 48 mm, and α indicates about 1.3714.

In order to form the 642 channels as one group within the width range of 35 mm, the widths of the signal pads positioned at the middle region, namely, at the 1' region, and those of the signal pads positioned at the 2' regions of the both edge regions are different, and in other words, the intervals between the signal pads in a same region is uniform. In the present invention, the width of the signal pads positioned at the 1' region, i.e. the inner signal pads, may be smaller than that of the signal pads positioned at the 2' regions, i.e. the outer signal pads, of both edge regions.

COFs (or TCPs) 130 are attached to be connected with the respective signal pads constituting at least one group with the size of 35 mm at the second area of the first substrate 111. As mentioned above, the COF 130 includes the FCT 131 and the driving IC 132 mounted on the FCT 131. Here, FCT 131 includes output wirings connected with the signal pads at the second area of the first substrate 111 for outputting data, input wirings formed to be separated from the output wirings for receiving data, and an opened IC region on which the driving IC 132 is mounted between the input wirings and the output wirings. The driving IC 132 includes a number of integrated driving circuits to apply data inputted from the exterior to the liquid crystal panel 110 according to a control signal to thus allow displaying of an image.

Of course, the COF 130 includes 642 channels, namely, output wirings, so as to be connected with the plurality of signal pads constituting at least one group formed on the second area of the first substrate 111. The 642 output wirings are formed with a width range of L/α, namely, 35 mm. In this case, when the COFs 130 are attached on the first substrate 111 through thermo-compression or the like, misalignment is bound to occur due to a TAB equipment or a material factor of the COFs 130 themselves. Thus, in the present invention, as shown in FIG. 4, the width of the output wirings formed at every region is the same within the width range of 35 mm, i.e. the width of the inner wirings is the same as the width of the outer wiring, and the intervals between output wirings positioned at the 1' region are different from intervals between the output wirings positioned at the 2' regions. In the present invention, the intervals between output wirings at the 1' region, i.e the inner wiring, may be smaller than the intervals between the output wirings positioned at 2' region, i.e. the outer wirings.

The driving PCB 120 is attached to the input wirings of the COFs 130. The driving PCB 120 generates a control signal to re-align R, G and B data applied from the exterior and apply the re-aligned R, G and B data to the liquid crystal panel 110 upon receiving vertical/horizontal synchronization signals, to thus display an image.

Figure 5A:
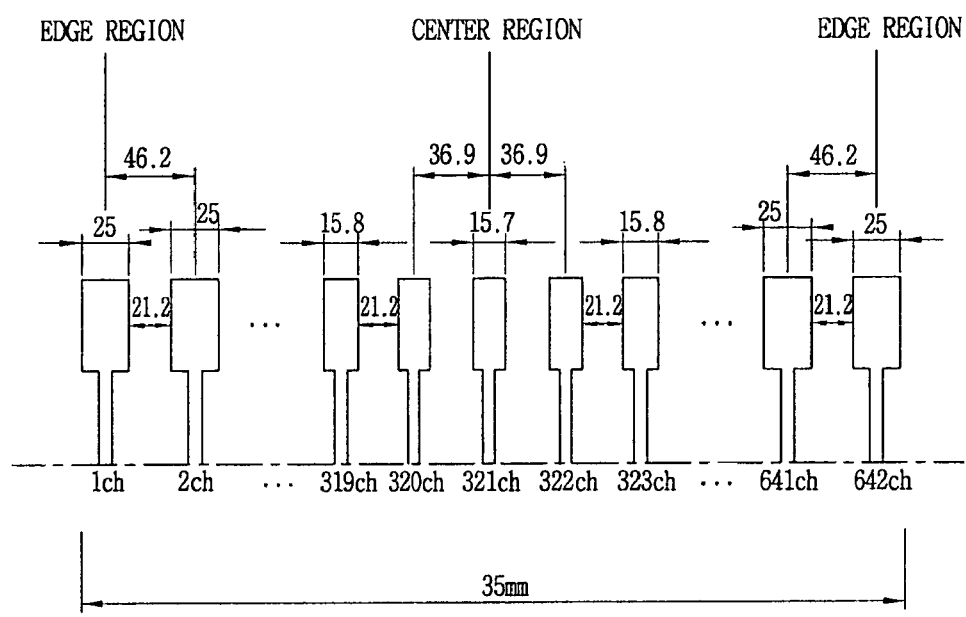
FIG. 5a is a plan view showing pads formed a second region of a first substrate.
Figure 5B:
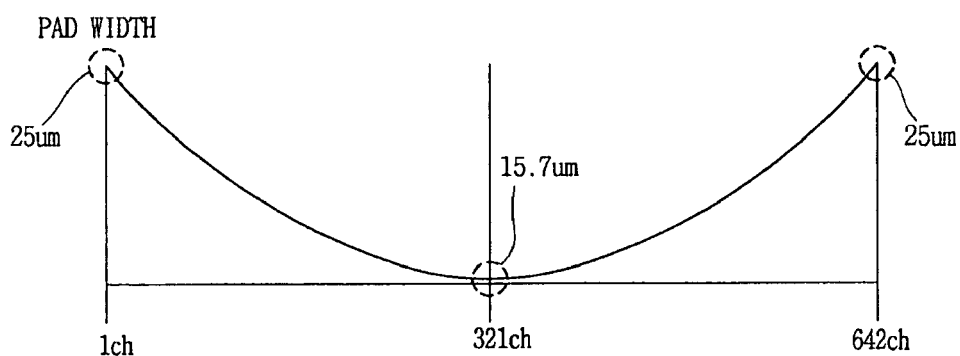

FIG. 5a is an plan view showing signal pads formed a second region of a first substrate, and FIG. 5b is a graph showing the characteristics of the width of the signal pads in FIG. 5a.

With reference to FIGS. 4, 5a and 5b, the signal pads on the first substrate 111 and the output wirings of the COFs 130 connected with the signal pads form 642 channels within range of the overall width (L/α) of 35 mm. The 642 channels go by two channels: For example, on the 1' region, $320^{th}$ channel and $322^{nd}$ channel based on the $321^{st}$ channel have the same width, and on the 2' region, $1^{st}$ and $2^{nd}$ channels and $641^{st}$ and $642^{nd}$ channels may have the same width.

As shown in FIGS. 5a and 5b, of the 642 signal pads formed on the first substrate 111, the $321^{st}$ signal pad positioned at the center has a width of 15.7 μm, the $1^{st}$ and $642^{nd}$ signal pads corresponding to the edge of the 2' region have a width of about 25 μm, and the widths (W) of the signal pads are gradually increased within the range of 15.7 μm<W<25 μm by units of two channels as it goes from the $321^{st}$ signal pad at the 1' region to the $1^{st}$ and $642^{nd}$ signal pads. In this case, the intervals between signal pads formed at every region are fixed as 21.2 μm. Accordingly, a signal pad pitch between the $321^{st}$ signal pad and the $320^{th}$ and $322^{nd}$ signal pads at the 1' region is 36.9 μm and a signal pad pitch between the $1^{st}$ and $2^{nd}$ signal pads and between $641^{st}$ and $642^{nd}$ signal pads at the 2' region is 46.2 μm.

Meanwhile, as for the COFs 130 attached on the first substrate 111, the width of the 642 output wirings is uniformly 14.2 μm at every region. In addition, the interval between the $321^{st}$ output wiring and the $320^{th}$ and $322^{nd}$ output wirings at the 1' region is 22.7 μm, the interval between the $1^{st}$ and $2^{nd}$ output wirings and $641^{st}$ and $642^{nd}$ output wirings at the 2' regions is 32 μm, and the intervals (d) between the output wirings are gradually increased within the range of 22.7 μm<d<32 μm by units of, for example, 2 channels as it goes from the $321^{st}$ output wiring at the 1' region toward the $1^{st}$ and $642^{nd}$ output wirings at the 2' regions. Accordingly, the pitch between the $321^{st}$ output wiring and the $320^{th}$ and $322^{nd}$ output wirings at the 1' region is about 36.9 μm and the pitch between the $1^{st}$ and $2^{nd}$ output wirings and $641^{st}$ and $642^{nd}$ output wirings at both 2' regions is about 46.2 μm.

Based on the above description, although 642 channels formed within the width range of 35 mm are used as reference in the present invention, but such numerical values may change as necessary. Thus, the plurality of signal pads on the first substrate 111 and the output wirings on the COFs 130 may be formed such that the width of the signal pads and the output wirings at the 1' region and the both 2' regions and the intervals between the signal pads and output wirings may be fixed or varied.

As for the signal pads on the first substrate 111, the intervals between the signal pads on the first substrate 111 may be fixed as 21.2 μm, and the widths of the signal pads are within the range of about 15.7 μm to 25 μm. In this case, the widths of the signal pads are increased as it goes from the signal pad at the center toward the signal pads positioned at the outermost portions of the edge regions.

As for the output wirings of the COFs 130, the width of the output wirings is fixed as 14.2 μm, and the intervals between output wirings are within the range of 22.7 μm to 32 μm. In this case, the intervals between the output wirings are increased as it goes from the output wiring positioned at the center toward the output wirings positioned at the outermost portions of the edge regions.

A method for fabricating an LCD will now be described with reference to FIGS. 3 and 4.

First, the first substrate 111 divided into a first area and a second area positioned at one side of the first area, and a second substrate 112 attached to the first area of the first substrate 111 are prepared. As the first and second substrates 111 and 112, glass substrate, quartz substrate, or the like may be used.

Subsequently, a plurality of gate lines and a plurality of data lines are formed to cross each other to define unit pixel regions on the first area, and switching elements are formed at crossings of the gate lines and the data lines. Pixel electrodes are formed in the unit pixel regions.

When the data lines, the data lines, the switching elements and the pixel electrodes are formed on the first area of the first substrate 111, a plurality of signal pads forming at least one group are formed on the second area of the first substrate 111 by extending from the gate and data lines of the first area. In the group of the signal pads, signal pads of the 1' region, the middle region, and the signal pads of the 2' regions, namely, both side regions, have different widths. In this case, the intervals between signal pads are the same.

The processes relate to the method for fabricating the liquid crystal panel 110, in which a metal layer is formed on the glass substrate and a photolithography process is performed thereon. For example, it is assumed that the data lines at the first area of the first substrate 111 and the data signal pads at the second area are simultaneously formed. In this case, gate electrodes, gate lines, insulation films, ohmic contact layers, semiconductor layers have been formed on the first substrate 111.

Thereafter, in order to form the data lines and the data pads on the first substrate 111, a metal layer made of a conductive material such as tungsten, molybdenum, etc., is deposited. Subsequently, photo resist of, for example, negative characteristics is coated, exposed by using a mask in which the width allowing light to be transmitted at the 1' region, the middle region, is smaller than the width allowing light to be transmitted at the 2' regions, the both side regions, and developed and etched to form the data lines, the signal pads at the 1' region and the signal pads at the 2' regions, the both side regions, extending from the data lines. In this case, the signal pads at the 1' region and the signal pads at the 2' regions have different widths and intervals between the signal pads are the same.

On the signal pads formed at the second area of the first substrate 111, there are attached output wirings which are connected with the signal pads and output data, input wirings separated from the output wirings, and COFs 130 including driving ICs 132 mounted at the opened IC regions formed between the input wirings and output wirings. In this case, the widths of the output wirings connected to correspond to the signal pads of the first substrate 111 are the same, and the intervals between output wirings at the both 2' regions and the 1' region are different.

The driving PCB 120 may be additionally provided to the input wirings of the COFs 130 to apply data to the liquid crystal panel 110 to implement an image.

The FCTs, namely, the COFs, of the LCD according to a first embodiment of the present invention will now be described.

Although not shown, the method for fabricating the COFs of the LCD according to the present invention includes: forming a metal film on a base film; patterning the metal film to form output wirings having the same width and input wirings separated from the output wirings, wherein the widths of the output wirings are the same at every region and the intervals between the output wirings become different as it goes toward the outermost output wiring based on the output wiring positioned at the center; forming an insulating layer on the base film with the input wirings and output wirings formed thereon; exposing both ends of the output wirings and both ends of the input wirings including a certain middle portion of the output wirings.

First, the base film made of a polyimide (PI) material is prepared.

Next, a metal layer made of copper (Cu) or the like assuming low resistivity is formed on the base film. Photo resist is coated on the metal layer, exposed, developed and etched to form at least one output wiring and an input wiring separated from the output wiring on the base film. In this case, the intervals between output wirings positioned at the 1' region and the intervals between output wirings at the 2' regions positioned at both sides of the 1' region are different. In the present invention, the interval between the output wirings at 1' region may be smaller than that between the output wirings at the 2' regions.

If it is assumed that output wirings having 642 channels in the width range of 35 mm are formed, the width of the output wirings at every region is 14.2 μm. In this case, the interval between the $321^{st}$ output wiring and the $320^{th}$ and $322^{nd}$ output wirings at the 1' region is 22.7 μm, the interval between the $1^{st}$ and $2^{nd}$ output wirings and $641^{st}$ and $642^{nd}$ output wirings at the 2' regions is 32 μm, and the intervals (d) between the output wirings are gradually increased within the range of 22.7 μm<d<32 μm by units of, for example, 2 channels as it goes from the $321^{st}$ output wiring at the 1' region toward the $1^{st}$ and $642^{nd}$ output wirings at the 2' regions. Accordingly, the pitch between the $321^{st}$ output wiring and the $320^{th}$ and $322^{nd}$ output wirings at the 1' region is about 36.9 μm and the pitch between the $1^{st}$ and $2^{nd}$ output wirings and $651^{st}$ and $642^{nd}$ output wirings at both 2' regions is about 46.2 μm.

Subsequently, an insulating layer is formed by using an insulating material on the base film with the output wirings and input wirings formed thereon, and a test signal pad parts positioned at both end portions of the input wirings and output wirings and at the middle region of the output wirings are exposed.

After the COFs in the roll form are fabricated, the COFs are inspected as to whether they have good electricity through a device including a probe card.

And then, the COFs in a roll form are cut off individually, excluding the test pad parts of the output wirings.

Thereafter, the driving ICs are mounted at the opened IC regions positioned between the output wirings and input wirings of the individual COFs to allow the input wirings and output wirings to be electrically conducted.

Subsequently, one side of the COFs with the driving ICs mounted thereon is attached to the driving PCB to which signals are applied from the exterior by an ACF, and the other side of the COFs is attached to the signal pad part of the liquid crystal panel that displays an image through an applied signal.

A method for fabricating the FCTs, namely, the TCPs, according to a second exemplary embodiment of the present invention will now be described.

Although not shown, the method for fabricating TCPs according to the present invention includes: forming device holes at certain intervals on a base film; forming a conductive layer made of a copper material by the medium of an adhesive on the base film with the device holes formed thereon; filling a resin in the device holes with the conductive layer formed thereon; forming a plurality of output wirings having the same width on the opposite surface of the base film filled with the resin and the input wirings separated from the output wirings such that intervals between output wirings become different as it goes from an output wiring positioned at the center toward the outermost output wiring; forming a plated layer on the output wirings and input wirings on the base film; and forming a solder resist layer exposing both ends of the output wirings and the input wirings including the test pad parts of the output wirings.

In more detail, the device holes are formed at certain intervals through punching on a tape type base film made of polyimide (PI) material. In this case, the device holes are where the driving ICs are to be mounted.

The conductive layer made of the copper material is bonded to the base film by using an adhesive, and then, the device holes are filled with the polyimide resin.

And then, the photo resist is coated on the conductive layer made of the copper material and then exposed, developed and etched to form a plurality of output wirings having the same width and input wirings separated from the output wirings. In this case, the intervals between output wirings positioned at the 1' region, namely, the middle region, and the intervals between output wirings at the 2' regions positioned at both sides of the 1' region are different. In the present invention, the interval between the output wirings at 1' region may be smaller than that between the output wirings at the 2' regions.

If it is assumed that output wirings having 642 channels in the width range of 35 mm are formed, the width of the output wirings at every region is 14.2 μm. In this case, the interval between the $321^{st}$ output wiring and the $320^{th}$ and $322^{nd}$ output wirings at the 1' region is 22.7 μm, the interval between the $1^{st}$ and $2^{nd}$ output wirings and $641^{st}$ and $642^{nd}$ output wirings at the 2' regions is 32 μm, and the intervals (d) between the output wirings are gradually increased within the range of 22.7 μm<d<32 μm by units of, for example, 2 channels as it goes from the $321^{st}$ output wiring at the 1' region toward the $1^{st}$ and $642^{nd}$ output wirings at the 2' regions. Accordingly, the pitch between the $321^{st}$ output wiring and the $320^{th}$ and $322^{nd}$ output wirings at the 1' region is about 36.9 μm and the pitch between the $1^{st}$ and $2^{nd}$ output wirings and $651^{st}$ and $642^{nd}$ output wirings at both 2' regions is about 46.2 μm.

Subsequently, the photo resist remaining on the output wirings and the input wirings on the base film are removed.

At least one of plating material including tin (Sn), gold, etc., is pre-plated on the output wirings and input wirings on the base film, from which the photo resist has been removed, to form a plated layer.

A solder resist layer is formed on the base film such that both end portions of the output wirings and input wirings formed on the base film and the test pad part positioned at one side of the output wirings are exposed.

After the TCPs in a roll form are fabricated, the TCPs are inspected as to whether they have good electricity through a device including a probe card.

And then, the TCPs in the roll form are cut off individually, excluding the test pad parts positioned at one side of the output wirings.

Thereafter, the driving ICs are mounted at the opened IC regions between the output wirings and input wirings of the individual TCPs to allow the input wirings and output wirings to be electrically conducted.

Subsequently, one side of the TCPs with the driving ICs mounted thereon is attached to the driving PCB to which signals are applied from the exterior by an ACF, and the other side of the TCPs is attached to the signal pad part of the liquid crystal panel that displays an image upon receiving a signal.

As so far described, according to the LCD and the method for fabricating FCTs for the LCD, when FCTs with a small width size (L/α), namely, a width size of 35 mm, having 642 channels, based on the 17-inch or 19-inch LCD, are attached, misalignment between the signal pads of the liquid crystal panel and the output wirings of the FCTs attached to the signal pads can be prevented, and accordingly, a defective LCD can be reduced.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device, comprising:
   a first substrate having a first area and a second area positioned at least one side of the first area;
   a plurality of signal pads constituting a plurality of groups in the second area of the first substrate, each group including a plurality of signal pads, the intervals between the signal pads in the group being the same, the pad width of the signal pads in the one group being the same, and the pad width of the signal pads in each group increasing as it goes from the central group toward the outermost group; and
   a plurality of output wirings of a film carrier tape attached on the signal pads constituting one group in the first substrate, the output wirings being grouped by a plurality of regions, wherein the output wirings at every region have the same width, and the interval between the output wirings in the central region is smaller than the interval between the output wirings in the outer region.

2. The device of claim 1, wherein the widths of the plurality of signal pads constituting the single group formed at the second area of the first substrate are gradually increased as it goes from the central signal pad toward the outermost signal pad.

3. The device of claim 1, wherein the film carrier taps are formed such that the intervals between output wirings are gradually increased as it goes from the output wiring in the central region toward the output wiring in the outer region.

4. The device of claim 1, wherein the signal pads are divided into a plurality of regions corresponding to the regions of the output wirings, the widths of the signal pads in the same region are the same, and the width of the signal pads in the central region is narrower than the width of the signal pads in the outer region.

5. A display device, comprising:
   a first substrate having a first area and a second area positioned at least one side of the first area;
   a group of signal pads formed within the second area, wherein the group of signal pads includes an first outer signal pad, a second outer signal pad next to the first outer signal pad, an first inner signal pad and a second inner signal pad next to the first inner signal pad, the width of the first inner signal pad is narrower than the width of the first outer signal pad and the interval between the first outer signal pad and the second outer signal pad is the same as the interval between the first inner signal pad and the second inner signal pad; and
   a film carrier tape with a group of output wirings connected to the group of signal pads, wherein the group of output wirings includes a first outer output wiring, a second outer output wiring next to the first outer output wiring, a first inner output wiring and a second inner output wiring next to the first inner output wiring, the width of the first inner output wiring is the same as the width of the first outer output wiring and the interval between the first outer output wiring and the second outer output wiring is wider than the interval between the first inner output wiring and the second inner output wiring.

6. The device of claim 5, wherein the first outer signal pad electrically connects to the first outer output wiring, and the first inner signal pad electrically connects to the first inner output wiring.

7. A method for fabricating a liquid crystal display, comprising:
   preparing a first substrate having a first area and a second area positioned at least one side of the first area;
   forming a plurality of gate lines and a plurality of data lines that cross each other to define unit pixels on the first area of the first substrate, and a plurality of gate pads and/or a plurality of data pads constituting at least one group in the second area of the first substrate by extending the gate lines and/or the data lines of the first area of the first substrate, a plurality of pads constituting at a plurality of groups, each group including a plurality of pads, the intervals between the pads in the group are the same, the pad width of the pads in the one group being same, and the pad width of pads in each group increasing as it goes from the central group toward the outermost group;
   forming switching elements at crossings of the gate lines and data lines; and
   attaching a film carrier tape on the gate pad and/or the data pad constituting the group in the first substrate, the output wirings being grouped by a plurality of regions, wherein the output wirings at every region have the same width, and the interval between the output wirings in the central region is smaller than the interval between the output wirings in the outer region.

8. The method of claim 7, wherein the widths of the plurality of pads constituting the single group formed at the second area of the first substrate are gradually increased as it goes from the central pad toward the outermost pad.

9. The method of claim 7, wherein the film carrier taps are formed such that the intervals between output wirings are gradually increased as it goes from the output wiring in the central region toward the output wiring in the outer region.

* * * * *